United States Patent [19]
O'Connell

[11] Patent Number: 5,198,709
[45] Date of Patent: Mar. 30, 1993

[54] ADDRESS TRANSITION DETECTOR CIRCUIT

[75] Inventor: Cormac M. O'Connell, Kanata, Canada

[73] Assignee: U.S. Philips Corp., New York, N.Y.

[21] Appl. No.: 721,050

[22] Filed: Jun. 26, 1991

[30] Foreign Application Priority Data

Jun. 29, 1990 [EP] European Pat. Off. ........ 90201733.4

[51] Int. Cl.⁵ ...................... H03K 19/00; H03K 19/21
[52] U.S. Cl. ................................... 307/480; 307/471; 307/269; 307/451
[58] Field of Search ............... 307/480, 451, 471, 518, 307/479, 269; 328/110, 159

[56] References Cited

U.S. PATENT DOCUMENTS

| | | | |
|---|---|---|---|
| 3,252,011 | 5/1966 | Zuk | 307/471 |
| 3,479,603 | 11/1969 | Overstreet, Jr. | 307/479 |
| 3,521,172 | 7/1970 | Harmon | 328/110 |
| 3,993,957 | 11/1976 | Davenport | 307/471 |
| 3,996,523 | 12/1976 | Schmid | 328/110 |
| 4,006,365 | 2/1977 | Marzin et al. | 307/471 |
| 4,039,858 | 8/1977 | Stewart | 307/471 |
| 4,717,835 | 1/1988 | Takeuchi | 307/265 |

FOREIGN PATENT DOCUMENTS 0232038 12/1987 European Pat. Off.

*Primary Examiner*—David Hudspeth
*Assistant Examiner*—Richard Roseen
*Attorney, Agent, or Firm*—Steven R. Biren

[57] ABSTRACT

A semiconductor integrated circuit including a detection circuit (e.g. an address transition detector) for detecting a change of a first and a second input signal. The detection circuit includes a first and a second resettable delay circuit and a gate circuit which is connected thereto. The gate circuit receives directly both the input signals and the output signals of the delay circuits for promptly outputting an output pulse signal with a minimum duration T for all durations of input signals.

7 Claims, 2 Drawing Sheets

ADDRESS TRANSITION DETECTOR CIRCUIT

BACKGROUND OF THE INVENTION

The invention relates to a semiconductor integrated circuit including a detection circuit for detecting a change of a first and/or a second digital input signal on a first and a second input terminal, respectively, the detection circuit delivering an output pulse signal having a predetermined duration in response to said change, the detection circuit comprising:

a first resettable delay circuit having an input terminal for receiving said first input signal and an output terminal for delivering a first output signal;

a second resettable delay circuit having an input terminal for receiving said second input signal and an output terminal for delivering a second output signal; and a gate circuit having input terminals and an output terminal for delivering said output pulse signal on said output terminal.

A circuit of the type mentioned above is known from the European Patent Application EP-A-0 232 038, the U.S. counterpart of which, U.S. Pat. No. 4,717,835, is incorporated herein by reference. Said circuit can e.g. be used in semiconductor memory devices for generating a pulse when an address change has been detected by the detection circuit, in order to promote discharge of word lines, charging bit lines, etcetera. Said pulse has a pulse width which is not shorter than a normal pulse width, even when noise appears on the address input signals.

SUMMARY OF THE INVENTION

It is inter alia an object of the present invention to provide a semiconductor integrated circuit including a detection circuit which is faster in operation.

For this purpose a semiconductor integrated circuit according to the invention is characterized in that said first and second input terminal and said output terminals of the first and second delay circuits are connected directly to respective input terminals of said gate circuit. Because of these direct connections, the gate circuit will respond directly to changes of the first and/or second input signal and changes of the output signals on the outputs of said delay circuits. However, the circuit as shown in U.S. Pat. No. 4,717,835 will operate much slower than the circuit according to the present invention, because the first and second input signal A and A and the outputs e' and f' of delay circuits 24 and 25 (see e.g. FIG. 3 of said application), respectively, have to propagate through NAND-gates 21 and 22, respectively, before an output pulse signal P can be generated by NAND-gate 23.

BRIEF DESCRIPTION OF THE DRAWING

The invention will now be further explained with reference to the embodiments represented in the drawing Figures, in which.

DESCRIPTION OF THE PREFERRED EMBODIMENTS

Figure 1:
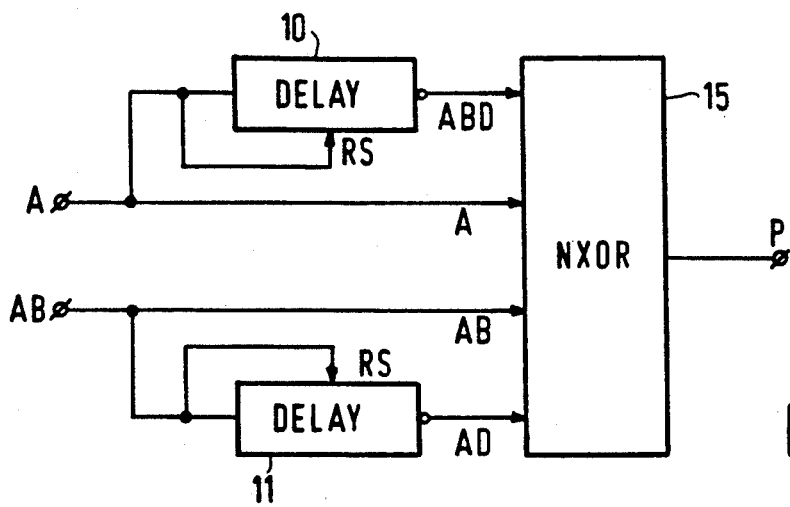
FIG. 1 shows a detection circuit in accordance with the invention.

FIG. 1 shows a detection circuit in accordance with the invention. The detection circuit receives input signals A and AB and comprises resettable delay circuits 10 and 11 and a non-exclusive-OR gate 15. Delay circuit 10 and 11 receive input signals A and AB, respectively, and deliver output signals ABD and AD, respectively. Non-exclusive-OR gate 15 receives signals A, AB, ABD and AD and delivers an output signal P.

In the further description, the signals that are logic-low or logic-high respectively, will be referred to as H or L, respectively.

Figure 2:
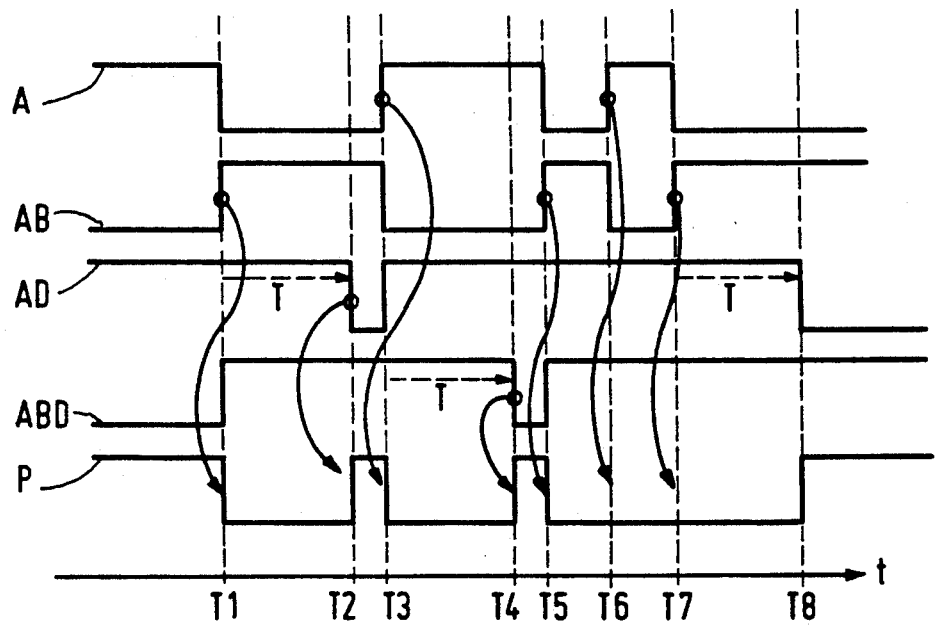
FIG. 2 shows a waveform diagram of the circuit shown in FIG. 1.

The operation of the detection circuit in FIG. 1 is as follows and will be described with reference to the waveform diagram as shown in FIG. 2: Input signals A and AB are complementary signals which may originate e.g. from an externally presented address signal, in which case the objective of the detection circuit is to detect a change of the presented address signals and subsequently deliver an output pulse P with a minimum duration T on its output.

It is to be noted that the circuit in accordance with the present invention provides a detection circuit which generates a pulse the length of which is never shorter than a predetermined minimum duration T irrespective of the timing of a signal change of the input signals A and AB.

Input signals A and AB in most cases originate from an input buffer which delivers as well the true (A) and the inverse form (AB) on its output of an address input signal on its input. For simplicity, however, this input buffer is not shown.

When input signal A is H, and input signal AB is subsequently L, output signal ABD is L and output signal AD is H (see FIG. 2 for t<T1). Output signal P is H.

When input signals A and AB change on t=T1 from H to L and L to H, respectively, delay circuit 11 is set and delay circuit 10 is reset. This means that in delay circuit 11 a delay of duration T is initiated which will end at t=T2, whereby T2−T1=T. Output signal ABD of delay circuit 10 is set H, because delay circuit 10 is reset. It is noted, in the case that delay circuit 10 or 11 is set, that output signal ABD or AD represents the logical inverse and delayed form of input signal A and AB, respectively, in the embodiment shown. However, according to the present invention, output signal ABD or AD may also be the non-inverted delayed form of input signal A and AB, respectively. In the case that delay circuit 10 or 11 is reset, output signal ABD or AD is the inverse form of input signal A and AB, respectively, as is shown in FIG. 2. However, it may be evident that, according to the present invention, output signal ABD or AD may be the non-inverted form of input signals A and AB, respectively.

Delay circuits 10 and 11 are set or reset when their respective input signals A and AB make a logical transition from L to H or H to L, respectively.

At t=T1, input signals A and AB change from H to L and L to H, respectively. As a result, delay circuit 10 will be reset and delay circuit 11 will be set. As a result, output signal ABD will become H. Output signal AD remains H and will remain H for a time period T after T1 till t=T2, as long as input signals A and AB do not change during the time interval T1<t<T2. Output signal P changes from H to L because one of the input signals A and AB, in this case input signal AB, changes from L to H.

At t=T2, output signal AD changes from H to L, because at t=T2 a time T has elapsed since t=T1 and because input signals A and AB have not changed during the time interval T1<t<T2. As a result, output signal P changes from L to H and remains H until a change of the input signals A and AB occurs.

At t=T3, input signal A changes from L to H causing output signal P to go from H to L, and input signal AB changes from H to L. Delay circuit 10 is set and delay circuit 11 is reset by input signal AB which changes from H to L. Output signal ABD remains high, because delay circuit 10 was set.

At t=T4, output signal ABD changes from H to L, because a time T has elapsed since t=T3 at which time the delay circuit 10 has been set, and because no changes have occurred in the signals A and AB during the time interval T3<t<T4. Because output signal ABD changes from H to L, output signal P changes from L to H.

At t=T5, input signal AB changes from L to H causing output signal P to go from H to L, and input signal A changes from H to L. As a consequence, delay circuit 11 is set, causing output signal AD to be H for at least another time interval T. Delay circuit 10 is reset by the input signal A. Therefore, output signal ABD changes from L to H.

At t=T6, input signals A and AB change from L to H and H to L, respectively. It is to be noted that the time interval between T6 and T5 is less than the time delay T of delay circuits 10 and 11. Delay circuit 10 is set by input signal A, and delay circuit 11 is reset by input signal AB. As a result, output signal AD remains H, because delay circuit 11 is reset. Because delay circuit 10 is set, output signal ABD remains H for at least a time interval after t=T6. As a consequence, output signal P remains L.

At t=T7, input signals A and AB change from H to L and L to H, respectively. It is to be noted again that the time interval between T7 and T6 is less than the time delay T of delay circuits 10 and 11. The changing of input signal AB causes output signal P to remain L. Delay circuits 10 and 11 are reset and set, respectively, by the input signals A and AB, respectively. As a result, output signal ABD remains H and output signal AD remains high for a time interval T after t=T7.

At t=T8, eventually, output signal AD changes from H to L, because a time T has elapsed since t=T7. A a result, output signal P changes from L to H. Output signal ABD remains H.

As is shown above, an output signal P is generated with a minimum predetermined duration T, irrespective of how fast input signals A and AB change their logical value, even when they change value within the time interval T. In addition, because of the direct connections of the input signals A and AB to the exclusive NOR-gate 15, the output signal P will respond as quickly as possible to a change of the input signals A and AB.

Figure 3:
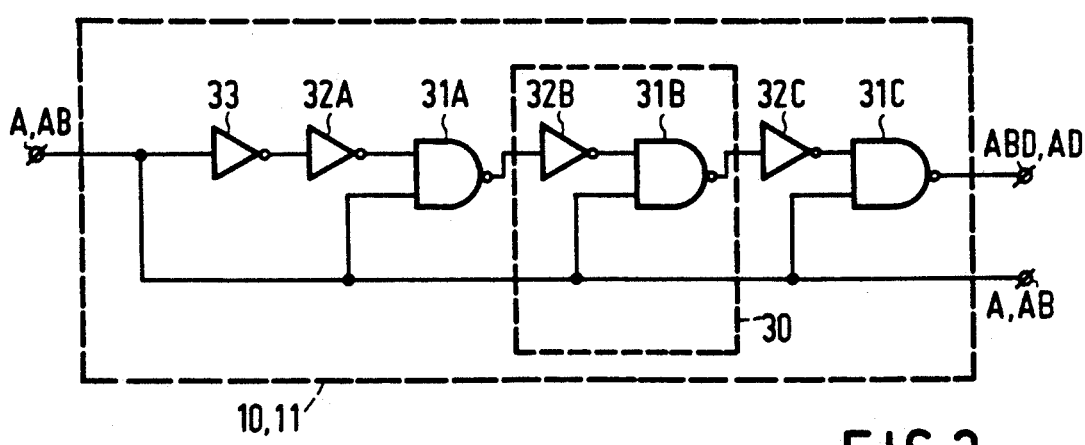
FIG. 3 shows a circuit diagram of an example of the delay circuits 10 and 11 as shown in FIG. 1.

FIG. 3 shows a circuit diagram of an example of the delay circuits 10 and 11 as shown in FIG. 1. The circuit comprises four inverters 32A, 32B, 32C and 33 and three NAND-gates 31A, 31B and 31C. Input signal A (in the case of delay circuit 10) or AB (in the case of delay circuit 11) is connected to the input of inverter 33 and the second inputs of NAND-gates 31A, 31B and 31C. The first input of NAND-gates 31A, 31B and 31C are connected to the output of inverters 321, 32B and 32C, respectively. The outputs of NAND-gates 31A and 31B are connected to the inputs of inverters 32B and 32C, respectively. The output of inverter 33 is connected to the input of inverter 32A and the output of NAND-gate 31C delivers the output signal ABD or AD, depending on whether the circuit receives the input signal A or AB, respectively.

The operation of the circuit in FIG. 3 is as follows. When the input signal A or AB is L, then the outputs of NAND-gates 31A, 31B and 31C are all H. This is the reset condition of the shown circuit. When input signal A or AB changes from L to H, this L to H transition is transferred to the first input of NAND-gate 31A with a delay which is constituted by the sum of the respective delays of inverters 33 and 32A. Then the output of NAND-gate 31A will change from H to L. This H to L transition is inverted by inverter 32B into an L to H transition. NAND-gate 31B will respond to this transition and will produce a H to L transition on its output. Again this transition is inverted by inverter 32C into an L to H transition, after which the output of NAND-gate 31C will change from H to L. So, in effect, a change from L to H of the input signal A (or AB), will produce a change of the output signal ABD (or AD) from H to L, which latter change will occur after a certain delay time. This delay time is constituted by the sum of the delays of the various elements which are coupled between the input and the output of the delay circuit as shown in FIG. 3, i.e. elements 33, 32A, 31A, 32B, 31B, 32C and 31C. As an example, 3 NAND-gates with corresponding inverters are shown in FIG. 3. It will be apparent that a delay circuit according to the invention may be constituted by a different number than 3 delay blocks 30, e.g. 4 delay blocks 30 or more for increasing the delay time T, or 1 or 2 delay blocks 30 for decreasing the delay time T.

The delay circuit 10 or 11 as presented in FIG. 3 has the advantage that this delay circuit will track the chip's circuit performance because the delay circuit is built with logic blocks only. Often a detection circuit according to the invention will be used in a chip e.g. a memory chip. When the chip's temperature rises, circuit performance normally decreases and then an extended output signal ABD or AD will be derived in order to guarantee a proper operation of the chip. Because delay circuit 10 or 11 is built with logic blocks only, the performance of this circuit will be influenced by the chip's temperature equally as the other part of the chip, like address decoders, memory cells, etcetera in a memory chip. In this way, a proper operation of the chip will be guaranteed.

However, delay circuits of an RC-nature, like the delay circuits presented in U.S. Pat. No. 4,717,835 (see e.g. FIG. 5 of said document), will not track the chip's circuit performance so well, because the resistors and capacitances used are strongly dependent on the chip's temperature.

Figure 4:
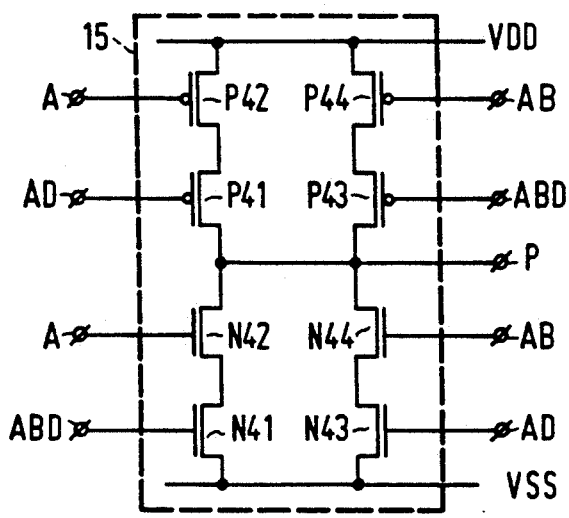
FIG. 4 shows a circuit diagram of an example of the non-exclusive-OR gate 15 as shown in FIG. 1.

FIG. 4 shows a circuit diagram of an example of the non-exclusive-OR gate 15 as shown in FIG. 1. Gate 15 consists of four PMOS-transistors P41-P44 and four NMOS-transistors N41-N44. Transistors P42, N42 and N41 are connected in series between a second and a first power supply terminal VDD and VSS, respectively. Also transistors P44, P43, N44 and N43 are connected in series between the second and the first power supply terminal VDD and VSS, respectively. The common node between PMOS-transistor P41 and NMOS-transistor N42 is connected to the common node between PMOS-transistor P43 and NMOS-transistor N44 and is also connected to an output node for delivering the output signal P. The gates of transistors P42 and N42 receive the input signal A, the gates of transistors P44 and N44 receive the input signal AB, the gates of transistors P43 and N41 receive the output signal ABD and the gates of transistors P41 and N41 receive the output signal AD.

The operation of the circuit in FIG. 4 is as follows. When input signals A and AB are L and H, respectively, and output signals AD and ABD are L and H, respectively, (as is shown in FIG. 2 for T2<t<T3 and t>T8) transistors P42 and P41 are conducting, and transistors P43, N42 and N43 are blocking. As a result output signal P is H.

When input signal A and AB are L and H, respectively, and output signals AD and ABD are both H, (as is shown in Figure T1<t<T2, T5<t<T6 and T7<t<T8), transistors N43 and N44 conduct, and transistors P43 and P44, P41 and N42 block. Therefore output signal P is L.

When input signals A and AB are H and L, respectively, and output signals AD and ABD are H and L, respectively, (as is shown in FIG. 2 for T4<t<T5 and t<T1), transistors P43 and P44 conduct, and transistors P42, P41, N41 and N44 block. As a result, output signal P is H.

When input signals A and AB are H and L, respectively, and output signals AD and ABD are both H (as is shown in FIG. 2 for T3<t<T4 and T6<t<T7), transistors N41 and N42 conduct and transistors P41, P42, P43 and N44 block. Therefore output signal P is L.

In the examples as presented above, it is assumed that input signals A and AB are complementary signals, that is when input signal A is H, then input signal AB is L and when input signal A is L, then input signal AB is H. During normal operation of the detection circuit input signals A and AB will indeed be complementary signals.

However, as described in U.S. Pat. No. 4,717,835, input signals A and AB might also have the same logical value, i.e. input signals A and AB both being L or both being H. When input signals A and AB are both L, this situation might correspond to a situation in which the integrated circuit is deselected. Input signals A and AB having the same logical value are then used for deselecting or disabling further circuitry, rather than by a chip select signal CS.

According to the invention, the detection circuit may also comprise means for detecting the situation in which input signals A and AB have the same logical value. When input signals A and AB are for instance both H, this corresponds to the situation in which the integrated circuit has to be deselected. The detection circuit might respond to this situation by keeping the output signal P L (low) as long as the situation occurs that input signals A and AB are both H. On the other hand, the detection circuit may be designed such that an output signal P should be generated which is L for only the duration T when one or both of the input signals A and AB change from L to H.

Figure 5:
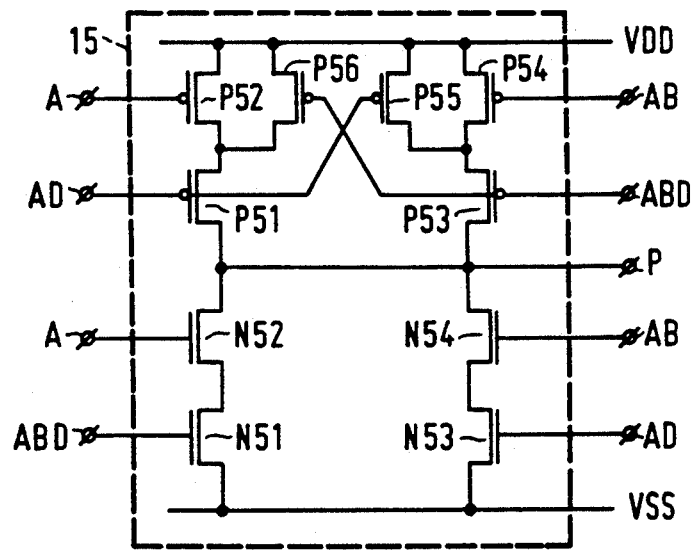
FIG. 5 shows a circuit diagram of another example of the non-exclusive-OR gate 15 as shown in FIG. 1.

FIG. 5 shows a circuit diagram of another example of the non-exclusive-OR gate 15 as shown in FIG. 1. When both input signals A and AB are H, then an output signal P is generated which is L for only the duration T. Gate 15 consists of six PMOS-transistors P51-P56 and four NMOS-transistors N51-N54. Gate 15 corresponds for a major part to the gate as shown in FIG. 4, except that the gate in FIG. 5 comprises two additional PMOS-transistors P55 and P56, which are connected in parallel with transistors P54 and P52, respectively, the gates of transistors P55 and P56 receiving the output signals AD and ABD, respectively.

The operation of the circuit in FIG. 5 is as follows. The operation of the gate is analog to the operation of the gate in FIG. 4, except that output signal P will be H after a time T when input signals A and AB have become H. When input signals A and AB become H, output signals ABD and AD will be H. As a result, transistors N51-N54 will conduct and output signal P will be L. A time delay T afterward output signals ABD and AD will become L. Then transistors P51, P53, P55 and P56 will conduct, as a result of which output signal P will become H.

Figure 6:
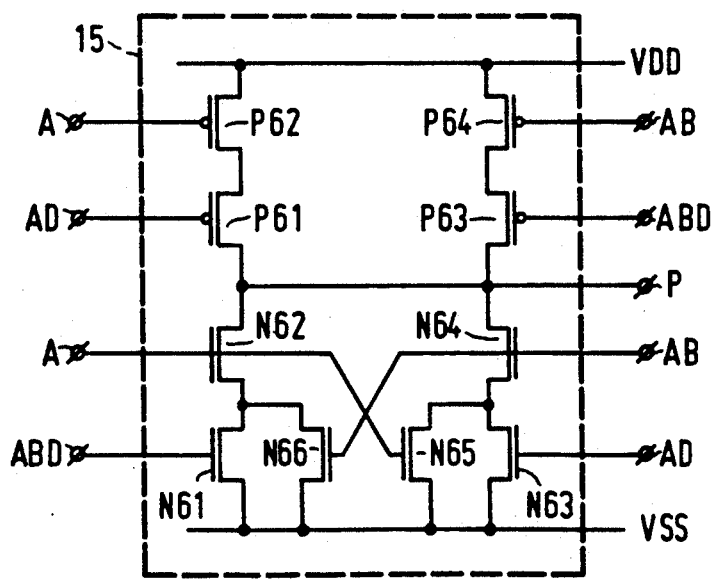
FIG. 6 shows a circuit diagram of yet another example of the non-exclusive-OR gate 15 as shown in FIG. 1.

FIG. 6 shows a circuit diagram of yet another example of the non-exclusive-Or gate 15 as shown in FIG. 1. When both input signals A and AB are H, then an output signal P is generated which remains L as long as input signals A and AB are H. Gate 15 consists of four PMOS-transistors P61-P64 and six NMOS-transistors N61-N66. Gate 15 corresponds for a major part to the gate as shown in FIG. 4, except that the gate in FIG. 6 comprises two additional NMOS-transistors N65 and N66, which are connected in parallel with transistors N63 and N61, respectively, the gates of transistors N65 and N66 receiving the input signals A and AB, respectively.

The operation of the circuit in FIG. 6 is as follows. The operation of the gate is analogue to the operation of the gate in FIG. 4, except that output signal P will remain L when input signals A and AB have become H. Output signal P will remain L, because transistors N62, N64, N65 and N66 conduct as long as input signals A and AB remain H.

In the examples as presented above, the output signal P became H again after time delay T (FIG. 5) or remained L (FIG. 6) when both input signals A and AB were H. It will be evident for those skilled in the art that also simular circuit diagrams can be made in which the situation is tested whereby both input signals A and AB are L. Therefore, it will be evident that these kinds of embodiments lie well within the scope of the present invention.

I claim:

1. A semiconductor integrated circuit including a detection circuit for detecting a change of at least one of a first and a second digital input signal on a first and a second input terminal, respectively, the detection circuit delivering an output pulse signal having a predetermined duration in response to said change, the detection circuit comprising:
   a first resettable delay circuit having an input terminal for receiving said first input signal, a reset terminal coupled to said input terminal and an output terminal for delivering a first output signal;
   a second resettable delay circuit having an input terminal for receiving said second input signal, a reset terminal coupled to said input terminal and an output terminal for delivering a second output signal; and
   a gate circuit having input terminals and an output terminal for delivering said output pulse signal on said output terminal; said first and second input terminals and said output terminals of the first and second delay circuits being connected directly to respective input terminals of said gate circuit.

2. A semiconductor integrated circuit according to claim 1, characterized in that at least one of the first and the second delay circuits comprises at least one inverter and one NAND-gate.

3. A semiconductor integrated circuit according to claim 1, characterized in that said gate circuit is an exclusive-OR gate.

4. A semiconductor integrated circuit according to claim 1, characterized in that said gate circuit is a non-exclusive-OR gate.

5. A semiconductor integrated circuit according to claim 4, characterized in that said non-exclusive-OR gate comprises four PMOS-transistors and four NMOS-transistors, an output of the non-exclusive-OR gate being connected to a first power supply via a first and a second PMOS-transistor which are connected in series, the output of the non-exclusive-OR gate being connected to the first power supply via a third and a fourth PMOS-transistor which are connected in series, the output of the non-exclusive-OR gate being connected to a second power supply via a first and a second NMOS-transistor which are connected in series, and the output of the non-exclusive-OR gate being connected to the second power supply via a third and a fourth NMOS-transistor which are connected in series, the gate of the first and third PMOS-transistors receiving the second and first output signal, respectively, the gate of the second and fourth PMOS-transistors receiving the first and second input signal, respectively, the gate of the first and third NMOS-transistors receiving the first and second output signal, respectively, and the gate of the second and fourth NMOS-transistors receiving the first and second input signal, respectively.

6. A semiconductor integrated circuit according to claim 5, characterized in that said non-exclusive-OR gate comprises a fifth and a sixth PMOS-transistor which are connected in parallel with the second and fourth PMOS-transistors, respectively, the gate of the fifth and sixth PMOS-transistors receiving the first and the second output signal, respectively.

7. A semiconductor integrated circuit according to claim 5, characterized in that said non-exclusive-OR gate comprises a fifth and a sixth NMOS-transistors which are connected in parallel with the first and third NMOS-transistors respectively, the gate of the fifth and sixth NMOS-transistors receiving the second and first input signal, respectively.

* * * * *